United States Patent
Baeumel et al.

(10) Patent No.: US 9,992,892 B2
(45) Date of Patent: Jun. 5, 2018

(54) CONNECTING DEVICE FOR CONNECTING ELECTRICAL LINES TO ELECTRICAL CONTACTS

(71) Applicant: CONTI TEMIC MICROELECTRONIC GMBH, Nuremberg (DE)

(72) Inventors: Hermann Baeumel, Neumarkt/OPF. (DE); Matthias Wieczorek, Neunkirchen am Sand (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 0 days. days.

(21) Appl. No.: 14/915,396

(22) PCT Filed: Nov. 13, 2014

(86) PCT No.: PCT/EP2014/074496
§ 371 (c)(1),
(2) Date: Feb. 29, 2016

(87) PCT Pub. No.: WO2015/082188
PCT Pub. Date: Jun. 11, 2015

(65) Prior Publication Data
US 2016/0219737 A1    Jul. 28, 2016

(30) Foreign Application Priority Data

Dec. 6, 2013   (DE) .......................... 10 2013 225 143

(51) Int. Cl.
*H01R 12/62*   (2011.01)
*H05K 5/06*   (2006.01)
(Continued)

(52) U.S. Cl.
CPC ........... *H05K 5/069* (2013.01); *H01R 12/592* (2013.01); *H01R 12/62* (2013.01); *H01R 13/5213* (2013.01); *H01R 43/005* (2013.01)

(58) Field of Classification Search
CPC ......... H01R 12/59; H01R 12/24; H01R 12/00
See application file for complete search history.

(56) References Cited

U.S. PATENT DOCUMENTS 3,214,713 A * 10/1965 Strobel .................. H01R 12/59
                                                             439/418
4,526,432 A *  7/1985 Cronin ................. H01R 12/777
                                                             439/320
(Continued)

FOREIGN PATENT DOCUMENTS

DE          10051945 C1    11/2001
DE       102010030074 A1   12/2011
(Continued)

*Primary Examiner* — Timothy Thompson
*Assistant Examiner* — Michael F McAllister
(74) *Attorney, Agent, or Firm* — Laurence A. Greenberg; Werner H. Stemer; Ralph E. Locher

(57) ABSTRACT

A connecting device electrically connects electrical lines to electrical contacts. The connecting device includes a flexible circuit board or printed circuit board, a base support and a cover. The electrical lines are disposed on the flexible circuit board. The flexible circuit board has a contact-making region, in which at least one electrical line is electrically connected to at least one electrical contact. The electrical contacts are disposed on the base support. The flexible circuit board is disposed between the base support and the cover. The base support and the cover form a sealed housing of the contact-making region. The circuit board and the cover are each composed of a flexible material, and the physical material properties of the circuit board and of the cover are substantially identical.

13 Claims, 1 Drawing Sheet

(51) Int. Cl.
*H01R 13/52* (2006.01)
*H01R 12/59* (2011.01)
*H01R 43/00* (2006.01)

(56) References Cited

U.S. PATENT DOCUMENTS

| | | | | |
|---|---|---|---|---|
| 4,647,125 | A * | 3/1987 | Landi | H01R 12/61 |
| | | | | 29/873 |
| 4,674,511 | A | 6/1987 | Cartmell | |
| 7,731,517 | B2 * | 6/2010 | Lee | H01R 12/592 |
| | | | | 439/271 |
| 8,821,167 | B2 * | 9/2014 | Ritner | H01R 12/771 |
| | | | | 439/67 |
| 2007/0026695 | A1 | 2/2007 | Lee et al. | |
| 2007/0151756 | A1 * | 7/2007 | Yamashita | H05K 3/20 |
| | | | | 174/260 |
| 2007/0167089 | A1 * | 7/2007 | Gobron | H01R 13/025 |
| | | | | 439/860 |
| 2007/0184682 | A1 * | 8/2007 | Gobron | A61B 5/04085 |
| | | | | 439/67 |
| 2009/0149036 | A1 * | 6/2009 | Lee | H01R 12/592 |
| | | | | 439/37 |
| 2012/0001648 | A1 | 1/2012 | Grudzien | |
| 2012/0149230 | A1 * | 6/2012 | Dove | H01R 12/59 |
| | | | | 439/345 |
| 2013/0008491 | A1 | 1/2013 | Rhein et al. | |
| 2013/0314878 | A1 | 11/2013 | Ott | |
| 2013/0323946 | A1 | 12/2013 | Ritner | |
| 2014/0256193 | A1 * | 9/2014 | Williams | H01R 12/716 |
| | | | | 439/696 |

FOREIGN PATENT DOCUMENTS

| | | |
|---|---|---|
| DE | 102010062653 A1 | 6/2012 |
| DE | 112011102258 T5 | 5/2013 |
| WO | 2008049724 A1 | 5/2008 |

* cited by examiner

CONNECTING DEVICE FOR CONNECTING ELECTRICAL LINES TO ELECTRICAL CONTACTS

BACKGROUND OF THE INVENTION

Field of the Invention

The invention relates to a connecting device for electrically connecting electrical lines to electrical contacts, and to a method for producing said connecting device.

Electronic apparatuses, for example control apparatuses, generally contain a large number of electronic components which are electrically connected to other components outside the apparatus. The electrical connections often have to be protected against environmental influences and mechanical influences. For example, in the construction of automotive transmissions and engines, electrical connections which have to be protected against aggressive media, such as oils and gases, and also against swarf are used both on and in the transmission or engine.

BRIEF SUMMARY OF THE INVENTION

The invention is based on the object of specifying an improved connecting device for electrically connecting electrical lines to electrical contacts, and also to a corresponding production method.

According to the invention, the object is achieved by the features described below.

Advantageous refinements of the invention are the subject matter of the dependent claims.

A connecting device according to the invention for electrically connecting electrical lines to electrical contacts comprises a flexible circuit board, a base support and a cover. The electrical lines are arranged on the flexible circuit board. The flexible circuit board has a contact-making region in which at least one electrical line is electrically connected to at least one electrical contact. The electrical contacts are arranged on the base support. The flexible circuit board is arranged between the base support and the cover, wherein the base support and the cover form a sealed housing of the contact-making region.

The contact-making region, in which the electrical lines of the flexible circuit board are connected to the electrical contacts, is shielded from the surrounding area, for example from aggressive media such as oils and gases, and also from swarf by the housing which is formed by the base support and the cover. The circuit board and the cover are each composed of a flexible material, in particular the same flexible material, such as polyimide or fiber-reinforced plastic for example. Therefore, the physical material properties of the circuit board and the cover, such as coefficient of linear expansion or modulus of elasticity for example, are substantially identical. This has the result, in particular, that no additional shear forces which can lead to the formation of gaps or cracks and therefore to leaks in the housing occur in the event of temperature fluctuations, which can lie between −30° C. and +150° C. in a transmission, in the region of the contact surface between the circuit board and the cover.

As a result, the electrical connections of the electrical lines to the electrical contacts are advantageously protected against damaging environmental influences, and therefore said connections can also be used, for example, in transmissions or engines of vehicles.

One refinement of the invention makes provision for the flexible circuit board to comprise electrical lines and an electronic circuit, in particular a transmission control unit with active and passive electronic components. As a result, the control unit is firstly protected in a media-tight manner in a housing and secondly electrically connected to components in the periphery of the housing by means of the circuit board so as to transmit signals and/or energy.

A further refinement of the invention makes provision for the flexible circuit board to have a connecting region which is cohesively connected to the base support and the cover and surrounds the contact-making region. As a result, the flexible circuit board is fixed between the base support and the cover without the contact-making region itself being fixedly connected to the base support or the cover, so that the contact-making region continues to remain flexible in the housing which is formed by the base support and the cover and tolerances which can occur for reasons of production or due to stresses or changes in temperature between the electrical lines and/or the circuit board and the electrical contacts, the base support and/or the cover can be compensated.

In this refinement of the invention, the connecting region is preferably cohesively connected to the base support and the cover by lamination or adhesive bonding or welding in each case. This advantageously allows a sealed connection between the flexible circuit board and the base support and the cover, so that the interior of the housing which is formed by the base support and the cover is shielded from the surrounding area. Particularly in the case of the lamination process at room temperature, it is advantageous to carry out this process under vacuum conditions since otherwise there is a risk of the flexible circuit board bulging out.

In order to avoid shear forces on the cohesive connection between the cover and the circuit board, and therefore to avoid leaks, the cover advantageously has a compensation contour for primarily compensating temperature-dependent fluctuations in volume.

A further refinement of the invention makes provision for the cover to be manufactured from a plastic or a foil/film. The choice of material is matched to the respective requirements dictated by the environment in which the connecting device is intended to be used.

The base support is preferably manufactured from a plastic. This advantageously makes it easier to arrange the electrical contacts on the base support.

At least one electrical line is preferably connected to at least one electrical contact by soldering, adhesive bonding, welding and/or pressing-in since this advantageously allows stable electrical connections between electrical lines and electrical contacts.

Furthermore, the flexible circuit board preferably has an outer region which is arranged outside the housing of the contact-making region, which housing is formed by the base support and the cover, and at least one electrical line is routed out of said housing by means of said outer region. As a result, electrical contact can advantageously be made with electrical lines and electrical contacts of the connecting device from the outside, that is to say with the housing closed.

In the method for establishing an electrical connection between electrical lines and electrical contacts, a base support which has electrical contacts, a flexible circuit board which has electrical lines and a contact-making region, and an, in particular, hat-like cover which has a hat brim section at the edge are initially provided.

An electrical connection is preferably established between the electrical contacts on the base support and the contact-making region of the circuit board at the same time as a cohesive connection is established between the circuit board and the base support, wherein at least one electrical contact is connected to at least one electrical line.

At least one electronic component, preferably an entire electronic circuit, is then arranged on the contact-making region of the circuit board and electrically connected to the electrical lines of the circuit board. Finally, the cover is placed on the circuit board and cohesively connected to said circuit board in a media-tight manner.

The circuit board and the cover are advantageously composed of a flexible material, wherein the physical material properties, such as coefficient of linear expansion and/or modulus of elasticity, of the circuit board and the cover are substantially identical. This has the result, in particular, that no additional shear forces which can lead to the formation of gaps or cracks and therefore to leaks in the connecting device occur in the event of temperature fluctuations in the contact region between the circuit board and the cover.

The cohesive connection between the cover and the circuit board is established, for example, by adhesive bonding or lamination. Particularly in the case of the lamination process at room temperature, it is advantageous to carry out this process under vacuum conditions since otherwise there is a risk of the flexible circuit board bulging out and the connecting region becoming leaky.

BRIEF DESCRIPTION OF THE SEVERAL VIEWS OF THE DRAWING

Further features, advantages and details can be gathered from the following description in which preferred exemplary embodiments are explained in greater detail with reference to the figures, in which.

DESCRIPTION OF THE INVENTION

Figure 1:
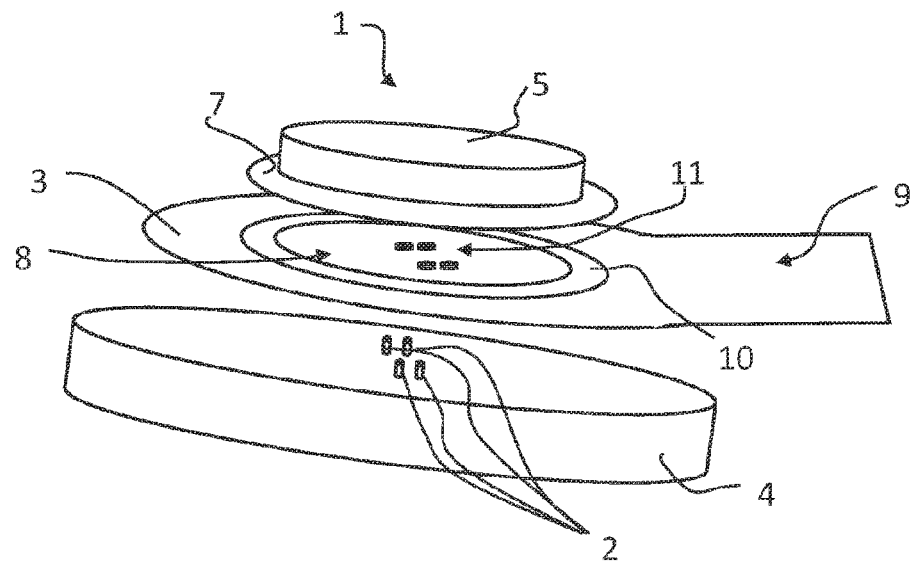
FIG. 1 shows an exploded perspective illustration of a connecting device for electrically connecting electrical lines to electrical contacts.

FIG. 1 shows an exploded perspective illustration of a connecting device 1 for electrically connecting electrical lines to electrical contacts 2. The connecting device 1 comprises a flexible circuit board 3, a base support 4 and a cover 5.

The base support 4 is in the form of a substantially cylindrical base and is manufactured, for example, from a plastic. A covering area of the surface of the base support 4, which covering area faces the flexible circuit board 3, has the electrical contacts 2 in the center. In FIG. 1, the electrical contacts 2 are in the form of metal connection pins. As an alternative, the electrical contacts 2 can also be realized by a lead frame.

In the exemplary embodiment illustrated in said figure, the cover 5 is in the form of a hat and has a hat brim section 7 as the circumferential sealing region, the bottom face of said hat brim section facing the flexible circuit board 3. The cover 5 is manufactured, for example, from a plastic or a foil/film.

The flexible circuit board 3 is fitted with the electrical lines, not illustrated in any detail in FIG. 1, in the form of conductor tracks. The flexible circuit board 3 has an inner region 8 which is arranged between the base support 4 and the cover 5, is substantially in the form of a circular disk, and has an outer region 9 which adjoins the inner region 8.

The inner region 8 of the flexible circuit board 3 has a ring-shaped connecting region 10 which is cohesively connected to the covering area of the base support 4 on one side and is cohesively connected to the bottom face of the hat brim section 7 of the cover 5 on the other side. The cohesive connections between the connecting region 10 and the base support 4 and the cover 5 are each established, for example, by lamination, adhesive bonding or welding in this case. Particularly when the lamination process is carried out at room temperature, it is advantageous to carry out said process under vacuum conditions since otherwise the flexible circuit board 3 can bulge out and leaks can occur in the connecting region 10 as a result.

Particularly when the connecting region 10 is adhesively bonded to the base support 4 and the cover 5, layout-related unevennesses, for example raised portions and recessed portions, in the conductor tracks of the foil/film conductor 3 can be compensated by the flexible material of the cover 5 and the circuit board 3 in connection with the adhesive and, as a result, leaks can be avoided in this region.

The connecting region 10 of the flexible circuit board 3 surrounds a contact-making region 11 in which electrical lines of the flexible circuit board 3 are electrically connected to electrical contacts 2, wherein a connection between an electrical line and an electrical contact 2 is preferably established by soldering.

The base support 4 and the cover 5 form a sealed housing for the contact-making region 11 of the flexible circuit board 3. The outer region 9 of the flexible circuit board 3 is situated outside this housing and routes electrical lines out of the housing.

Figure 2:
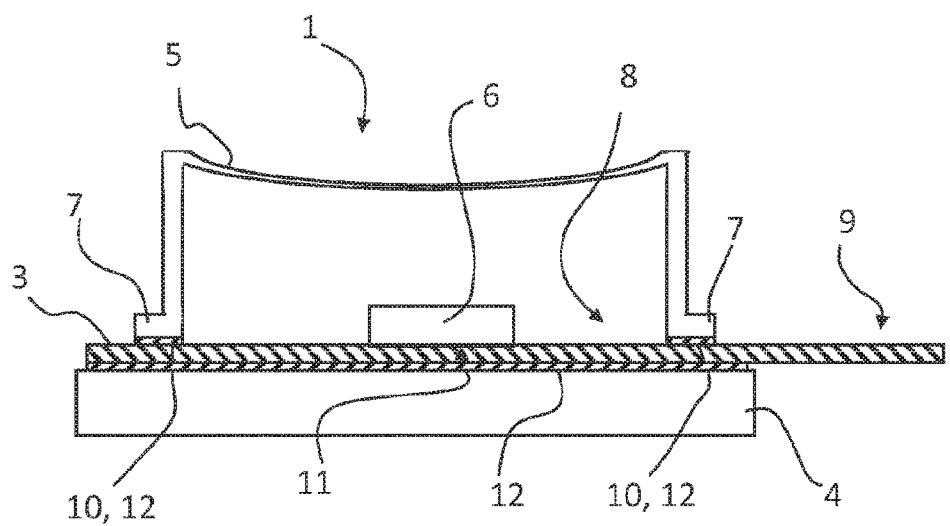
FIG. 2 shows a section through a connecting device for electrically connecting electrical lines to electrical contacts.

FIG. 2 shows a section through a connecting device, wherein an electronic circuit 6, in particular a transmission control unit with active and passive electronic components, is arranged on the circuit board 3 in the contact-making region 11. As a result, the electronic circuit 6 is firstly arranged such that it is protected in a media-tight manner in a housing and secondly electrically connected to components in the periphery of the housing by means of the circuit board 3 so as to transmit signals and/or energy.

In this case, the flexible circuit board 3 is joined over its entire surface area to the base support 4 by means of the cohesive connection 12. The cover 5, by way of its circumferential sealing region which is designed as a hat brim section 7, is joined to the connecting region 10 of the circuit board by means of the cohesive connection 12.

That section of the cover 5 which is opposite the circuit board 3 is of concave-convex design in FIG. 2. Owing to this shape and the material properties of the flexible cover 5, changes in volume in the housing which consists of the cover 5 and the base support 4, which changes in volume are caused by temperature fluctuations, and resulting shear forces, which cause leaks, in the connecting region 10 of the circuit board can be avoided to a particular extent.

LIST OF REFERENCE SYMBOLS

1 Connecting device
2 Electrical contact
3 Flexible circuit
4 Base support
5 Cover
6 Electronic circuit
7 Hat brim section
8 Inner region
9 Outer region
10 Connecting region 11 Contact-making region
12 Cohesive connection

The invention claimed is:

1. A connecting device for electrically connecting electrical lines to electrical contacts, the connecting device comprising:
   a cover;
   a base support on which the electrical contacts are disposed;
   a flexible circuit board on which the electrical lines are disposed, said flexible circuit board being disposed between said base support and said cover, said flexible circuit board having a contact-making region in which at least one of the electrical lines is electrically connected to at least one of the electrical contacts;
   said base support and said cover forming a sealed housing for said contact-making region;
   said flexible circuit board and said cover having substantially identical physical material properties and each being composed of a flexible material; and
   said flexible circuit board having a connecting region cohesively connected to said cover.

2. The connecting device according to claim 1, wherein said flexible circuit board is fitted with the electrical lines and is fitted with at least one electronic circuit.

3. The connecting device according to claim 1, wherein said connecting region of said flexible circuit board surrounds said contact-making region and is cohesively connected to said base support and said cover.

4. The connecting device according to claim 3, wherein said connecting region is cohesively connected to each of said base support and said cover by lamination or adhesive bonding or welding.

5. The connecting device according to claim 4, wherein said cohesive connection between said cover and said flexible circuit board has properties of having been established under vacuum at room temperature.

6. The connecting device according to claim 4, wherein said cover has a compensation contour provided to avoid shear forces on said cohesive connection between said cover and said flexible circuit board.

7. The connecting device according to claim 1, wherein said cover is formed of plastic or foil or film.

8. The connecting device according to claim 1, wherein said base support is formed of plastic or metal.

9. The connecting device according to claim 1, wherein at least one of the electrical lines is connected to at least one of the electrical contacts by at least one of soldering or adhesive bonding or welding or pressing-in.

10. The connecting device according to claim 1, wherein said flexible circuit board has an outer region disposed outside of said contact-making region housing formed by said base support and said cover, and at least one of the electrical lines is routed out of said housing by said outer region.

11. A method for establishing an electrical connection between electrical lines and electrical contacts by using a connecting device, the method comprising the following steps:
    providing a base support having electrical contacts;
    providing a flexible circuit board composed of a flexible material, having physical material properties, having electrical lines and having a contact-making region;
    providing a hat-shaped cover composed of a flexible material, having physical material properties substantially identical to the physical material properties of the flexible circuit board and having a hat brim-shaped section;
    establishing a cohesive connection between the flexible circuit board and the base support and simultaneously establishing an electrical connection between the electrical contacts on the base support and the contact-making region of the flexible circuit board including a connection between at least one of the electrical contacts and at least one of the electrical lines;
    placing at least one electronic component on the contact-making region of the flexible circuit board;
    establishing an electrical connection between the electronic component and the electrical lines of the flexible circuit board; and
    establishing a cohesive connection between the cover and the flexible circuit board.

12. The method according to claim 11, wherein the at least one electronic component is an electronic circuit.

13. The method according to claim 11, which further comprises establishing the cohesive connection between the cover and the circuit board under vacuum at room temperature.

* * * * *